United States Patent
Shen et al.

(10) Patent No.: US 8,039,891 B2
(45) Date of Patent: Oct. 18, 2011

(54) SPLIT CHARGE STORAGE NODE OUTER SPACER PROCESS

(75) Inventors: Minghao Shen, Sunnyvale, CA (US); Chungho Lee, Sunnyvale, CA (US); Hiroyuki Kinoshita, San Jose, CA (US); Huaqiang Wu, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/980,716

(22) Filed: Dec. 29, 2010

(65) Prior Publication Data
US 2011/0095355 A1    Apr. 28, 2011

Related U.S. Application Data

(62) Division of application No. 11/924,169, filed on Oct. 25, 2007, now Pat. No. 7,883,963.

(51) Int. Cl.
*H01L 29/792* (2006.01)
(52) U.S. Cl. ........................................ 257/326; 257/314
(58) Field of Classification Search .................. 257/326, 257/314
See application file for complete search history.

(56) References Cited

U.S. PATENT DOCUMENTS
7,368,347 B2    5/2008 Joshi et al.

OTHER PUBLICATIONS

U.S. Office Action dated Jul. 13, 2010 corresponding to U.S. Appl. No. 11/924,169, filed Oct. 25, 2007.

*Primary Examiner* — Douglas Menz
(74) *Attorney, Agent, or Firm* — Turocy & Watson, LLP

(57) ABSTRACT

Memory cells containing two split sub-lithographic charge storage nodes on a semiconductor substrate and methods for making the memory cells are provided. The methods can involve forming two split sub-lithographic charge storage nodes by using spacer formation techniques. By removing an exposed portion of a fist poly layer between sloping side surfaces or outer surfaces of spacers while leaving portions of the first poly layer protected by the spacers, the method can provide two split sub-lithographic first poly gates. Further, by removing an exposed portion of a charge storage layer between sloping side surfaces or outer surfaces of spacers, the method can provide two split, narrow portions of the charge storage layer, which subsequently form two split sub-lithographic charge storage nodes.

20 Claims, 9 Drawing Sheets

SPLIT CHARGE STORAGE NODE OUTER SPACER PROCESS

CROSS-REFERENCE TO RELATED APPLICATION

This application is a Divisional of U.S. Patent Application Ser. No. 11/924,169 filed Oct. 25, 2007 and entitled SPLIT CHARGE STORAGE NODE OUTER SPACER PROCESS, the entirety of which is incorporated herein by reference.

TECHNICAL FIELD

Disclosed are memory cells containing two split sub-lithographic first poly gates and two split sub-lithographic charge storage nodes on a semiconductor substrate and methods of forming the memory cells.

BACKGROUND

Modern computing devices utilize a variety of kinds of memory devices to store and access information. Memory devices include the general classes of random access memories (RAM) and read only memories (ROM). These classes further contain static RAM (SRAM), dynamic RAM (DRAM), programmable ROM (PROM), electrically programmable ROM (EPROM), electrically erasable PROM (EEPROM), as well as FLASH memory, and the like. Most memory devices employ an internal architecture in the form of an array memory of bit cells, containing plural rows and plural intersecting columns.

A memory cell is placed at each intersecting row and column in the array. Typically, a particular memory cell is accessed by activating its row and then reading or writing the state of its column. Memory sizes are defined by the row and column architecture. For example, a 1024 row by 1024 column memory array defines a memory device having one megabit of memory cells. The array rows are referred to as word lines and the array columns are referred to as bit lines.

The trend in semiconductor memory devices has been toward higher circuit density with higher numbers of bit cells per device, lower operating voltages, and higher access speeds. To achieve these high densities there have been, and continue to be, efforts toward scaling down device dimensions (e.g., at sub-micron levels). This may include lengths of drain-source channel, storage node, and the like. The requirement of small features with close spacing between adjacent features requires sophisticated manufacturing techniques.

SUMMARY

The following presents a simplified summary of the innovation disclosed herein in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

One aspect of the innovation disclosed herein provides memory cells containing two split sub-lithographic first poly gates and two split sub-lithographic charge storage nodes on a semiconductor substrate. The memory cells can contain two split sub-lithographic charge storage nodes on a semiconductor substrate; two split sub-lithographic first poly gates on the two split sub-lithographic charge storage nodes; implanted portions in the semiconductor substrate under the two split sub-lithographic charge storage nodes; a center oxide between the two split sub-lithographic charge storage nodes on the semiconductor substrate; a second poly gate between the two split sub-lithographic charge storage nodes; and a third poly gate over the semiconductor substrate. Since the memory cells have the two split sub-lithographic charge storage nodes separated by the center oxide, the memory cells can have two physically distinct bits.

Another aspect of the innovation disclosed herein provides methods of forming memory cells containing two split sub-lithographic first poly gates and two split sub-lithographic charge storage nodes on a semiconductor substrate. The methods can involve providing a charge storage layer, a first poly layer, and a patterned first mask layer on a semiconductor substrate; forming a patterned first poly layer and first openings in the patterned first poly layer and the charge storage layer using the patterned first mask layer as a mask; forming a center oxide layer and a second poly in the first opening; removing the patterned first mask layer; forming spacers adjacent side surfaces of the center oxide layer and on portions of the upper surface of the patterned first poly layer; and forming sub-lithographic first poly gates, split sub-lithographic charge storage nodes, and bit line openings by removing exposed portions of the patterned first poly layer and at least portion of the exposed portions of the charge storage layer that are not covered with the spacer.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments are indicative, however, of but a few of the various ways in which the principles of the innovation may be employed. Other objects, advantages and novel features of the innovation will become apparent from the following detailed description of the innovation when considered in conjunction with the drawings.

DETAILED DESCRIPTION

Figure 1:
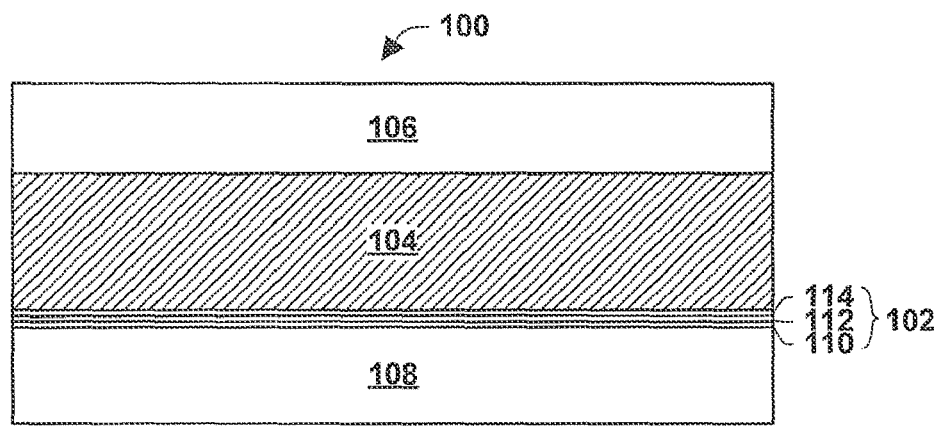
FIG. 1 illustrates a cross sectional view of an intermediate state of a portion of an exemplary semiconductor structure containing a charge storage layer, a first poly layer, and a first mask layer over a semiconductor substrate in accordance with an aspect of the subject innovation.

The innovation disclosed herein provides methods of forming memory cells containing sub-lithographic sized structures (e.g., two split sub-lithographic first poly gates and two split sub-lithographic charge storage nodes) using spacer formation techniques. The sub-lithographic components may be formed into any type of electrical structure including a memory cell, such as a flash memory cell used in a non-volatile memory device. By removing exposed portions of a fist poly layer while leaving portions of the first poly layer protected by the spacers, the method can provide two split sub-lithographic first poly gates. Further, by removing exposed portions of a charge storage layer while leaving portions of the charge storage layer protected by the spacers, the method can provide two split, narrow portions of the charge storage layer. Each of the small structures subsequently forms a sub-lithographic charge storage node of a memory cell.

Consequently, the length of the sub-lithographic structure formed is dependent upon spacer formation techniques rather than photolithography techniques. In other words, the length of the sub-lithographic structure is controlled and/or determined mainly by the limitations of spacer formation techniques rather than the limitations of photolithography techniques. Moreover, the two split sub-lithographic charge storage nodes can be separated by a dielectric such as oxides, thereby preventing and/or mitigating a signal crossover between the two split sub-lithographic charge storage nodes. As a result, the sub-lithographic charge storage nodes may be formed in a reliable manner and can have dimensions less than a minimum dimension achievable by a resolution limit of lithography. The methods therefore effectively address the concerns raised by the trend towards the miniaturization of memory devices.

The innovation is now described with reference to the drawings, wherein like reference numerals are used to refer to like elements throughout. In the following description, for purposes of explanation, numerous specific details are set forth in order to provide a thorough understanding of the innovation. It may be evident, however, that the innovation can be practiced without these specific details. In other instances, well-known structures and devices are shown in block diagram form in order to facilitate describing the innovation.

Referring to FIGS. 1 to 18, one of many possible exemplary embodiments of forming a memory cell containing two split sub-lithographic charge storage nodes is illustrated. Specifically, FIGS. 1 to 18 illustrate a method of forming a memory cell containing two split sub-lithographic charge storage nodes by a using outer spacer process.

FIG. 1 illustrates a cross sectional view of an intermediate state of a portion of an exemplary semiconductor structure 100. The semiconductor structure 100 can contain a charge storage layer 102, a first poly layer 104, and a first mask layer 106 over a semiconductor substrate 108. The semiconductor structure 100 can further contain other layers/components. For example, the semiconductor structure 100 may contain a tunnel oxide (not shown) between the charge storage layer 102 and the semiconductor substrate 108.

In one embodiment, the semiconductor structure 100 is portion of a memory device. Examples of memory devices include a volatile memory and a non-volatile memory. Examples of volatile memory include RAM such as SRAM, DRAM, synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM). Examples of non-volatile memory include ROM, PROM, EPROM, EEPROM, or flash memory. For example, the semiconductor structure 100 is a portion of high-density core regions of a non-volatile memory device.

When the semiconductor structure 100 is a portion of a memory device, the semiconductor structure 100 can be either a portion of high-density core regions of a non-volatile memory device or a portion of low-density peripheral regions of a non-volatile memory device. The high-density core region typically includes one or more M×N array cores of individually addressable, substantially identical memory cells.

The semiconductor substrate 108 may contain any suitable semiconductor material on which electric devices such as memory cell transistors can be formed. Examples of semiconductor materials include silicon, gallium arsenide, indium phosphide, and the like.

The charge storage layer 102 is formed over the semiconductor substrate 108. The configuration and/or constituent of the charge storage layer 102 may vary and are not critical to the subject innovation. The charge storage layer 102 generally can contain any suitable charge storage dielectric material. Examples of charge storage dielectric materials include nitrides (e.g., silicon nitride, silicon oxynitride, and silicon rich nitride), oxides, silicates, a high-k die)ectric, for example, having a dielectric constant higher than that of silicon dioxide ($SiO_2$), and the like. In one embodiment, the charge storage dielectric material contains silicon nitride, silicon oxynitride, and/or silicon rich nitride. In another example, the charge storage material contains oxides or silicates containing Al, Ta, Hf, La, Zr, Ti, Nb, Cr, V, Y, Ce and/or Pr. The charge storage layer 102 can be formed by any suitable technique. For example, the storage element 112 can be formed by chemical vapor deposition (CVD), lithography, and etching techniques.

Typically, the charge storage layer 102 contains three separate layers: a first insulating layer, a charge storage dielectric layer, and a second insulating layer. Although any type of charge storage layer can be applied to the semiconductor structure 100, the innovation is hereinafter illustrated and described in the context of an exemplary charge storage layer 102 that contains a first insulating layer 110, a charge storage dielectric layer 112, and a second insulating layer 114. The first and second insulating layers 110 and 114 are typically formed of an oxide dielectric such as silicon dioxide ($SiO_2$) and the charge storage dielectric layer 112 is generally formed of a nitride dielectric such as silicon nitride ($Si_xN_y$). The oxide-nitride-oxide configuration may be referred to as an ONO tri-layer. Especially, when the nitride layer contains silicon rich nitride, the first oxide layer 110, nitride layer 112, and second oxide layer 114 may be referred to as an ORO tri-layer. The oxide-nitride-oxide tri-layer can be fabricated by forming a first silicon oxide layer 110, forming a silicon nitride layer 112 on the first silicon oxide layer, and forming a second silicon oxide layer 114 on the silicon nitride layer.

The heights of the first oxide layer 110 and second oxide layer 114 may vary and are not critical to the innovation. The first oxide layer 110 and second oxide layer 114 have independently any suitable height that depends on the desired implementations and/or the memory cell being fabricated. In one embodiment, the heights of the first oxide layer 110 and second oxide layer 114 are independently about 1 nm or more and about 10 nm or less. In another embodiment, the heights of the first oxide layer 110 and second oxide layer 114 are independently about 2 nm or more and about 8 nm or less. In yet another embodiment, the heights of the first oxide layer 110 and second oxide layer 114 are independently about 3 nm or more and about 7 nm or less. In still yet another embodiment, the heights of the first oxide layer 110 and second oxide layer 114 are about 5 nm.

The height of the nitride layer 112 may vary and is not critical to the subject innovation. The nitride layer 112 has any suitable height that depends on the desired implementations and/or the memory cell being fabricated. In one embodiment, the height of the nitride layer 112 is about 1 nm or more and about 20 nm or less. In another embodiment, the height of the nitride layer 112 is about 2 nm or more and about 15 nm or less. In yet another embodiment, the height of the nitride layer 112 is about 3 nm or more and about 10 nm or less. In still yet another embodiment, the height of the nitride layer 112 is about 7 nm.

The first poly layer 104 typically contains polysilicon. The height of the first poly layer 104 may vary and is not critical to the subject innovation. The first poly layer 104 has any suitable height that depends on the desired implementations and/or the memory cell being fabricated. In one embodiment, the height of the first poly layer 104 is about 30 nm or more and about 300 nm or less. In another embodiment, the height of the first poly layer 104 is about 50 nm or more and about 200 nm or less. In yet another embodiment, the height of the first poly layer 104 is about 70 nm or more and about 150 nm or less. In still yet another embodiment, the height of the first poly layer 104 is about 100 nm.

The first mask layer 106 may contain any suitable mask material. Examples of mask materials include nitrides such as silicon nitride ($Si_xN_y$), silicon rich nitride, and oxygen rich nitride; oxides such as silicon oxide ($Si_xO_y$) and silicon-dioxide ($SiO_2$); and the like.

The height of the first mask layer 106 may vary and is not critical to the subject innovation. The first mask layer 106 has any suitable height that depends on the desired implementations and/or the memory cell being fabricated. In one embodiment, the height of the first mask layer 106 is about 20 nm or more and about 400 nm or less. In another embodiment, the height of the first mask layer 106 is about 40 nm or more and about 300 nm or less. In yet another embodiment, the height of the first mask layer 106 is about 60 nm or more and about 200 nm or less. In still yet another embodiment, the height of the first mask layer 106 is about 120 nm.

Although not shown, an anti-reflective coating (ARC) can be formed on the first mask layer 106 for increasing resolution of a subsequent lithography process. Any suitable ARC material can be employed. For example, ARC contains oxides such as silicon oxide ($Si_xO_y$) and silicon-dioxide ($SiO_2$); nitrides such as silicon nitride ($Si_xN_y$), silicon rich nitride, and oxygen rich nitride; carbides such as silicon carbide ($Si_xC_y$); amorphous carbon; and the like.

Figure 2:
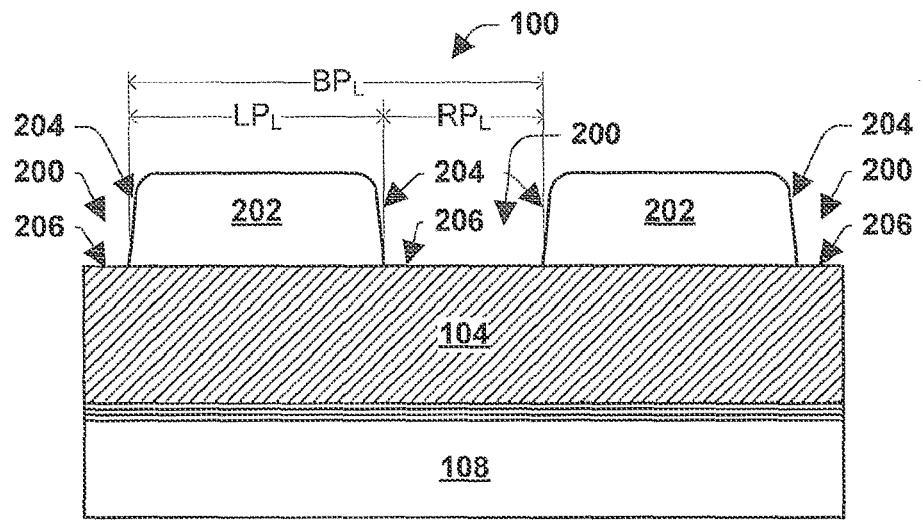
FIG. 2 illustrates patterning the first mask layer by removing portions of the first mask layer on the semiconductor substrate, thereby forming a patterned first mask layer in accordance with an aspect of the subject innovation.

FIG. 2 illustrates patterning the first mask layer 106 by removing portions 200 of the first mask layer 106, thereby forming a patterned first mask layer (e.g., left portions of the first mask layer 106) 202. The patterned first mask layer 202 has side surfaces 204. The first poly layer 104 has exposed portions 206 that are not covered with the patterned first mask layer 202. The portions 200 of the first mask layer 106 can be removed by any suitable technique. For example, the portions 200 are removed by lithography and etching techniques. Any suitable etching process can be used. For example, a plasma etch can be used to remove the portions 200.

The patterned first mask layer 202 can have any suitable cross-sectional shape. In one embodiment, the upper corners of the patterned first mask layer 202 are rounded by the patterning process. In anther embodiment, the upper corners of the patterned first mask layer 202 are not rounded by the patterning process (not shown). In yet another embodiment, the patterned first mask layer 202 has relatively sloping side surfaces 204 that extend perpendicular to the topological surface of the semiconductor substrate 108. In still yet another embodiment, the patterned first mask layer 202 has relatively vertical side surfaces (not shown).

The removed portions 200 of the first mask layer 106 correspond to positions on which a second poly gate or center poly gate is formed in subsequent processes. The left portions 202 of the first mask layer 106 correspond to positions on which two split charge storage nodes and one bit line therebetween are formed in subsequent processes. The detailed configuration of the semiconductor structure 100 is described below.

For simplicity of illustration in FIG. 2, three removed portions 200 and two left portions 202 of the first mask layer 106 are shown. However, the semiconductor structure 100 can have any suitable number of removed portions and left portions of the first mask layer. For example, the semiconductor structure 100 can have a M×N array of left portions 202 with M rows and N columns.

The patterned first mask layer 202 has any suitable length of the removed portion 200 and left portion 202 that depend on the desired implementations and/or the memory cell being fabricated. The length ($RP_L$) of the removed portions 200 and length ($LP_L$) of the left portions 202 may vary and are not critical to the subject innovation. In one embodiment, the length ($RP_L$) of the removed portion 200 is about 30 nm or more and about 150 nm or less. In another embodiment, the length ($RP_L$) of the removed portion 200 is about 40 nm or more and about 130 nm or less. In yet another embodiment, the length ($RP_L$) of the removed portion 200 is about 50 nm or more and about 100 nm or less. In still yet another embodiment, the length ($RP_L$) of the removed portion 200 is about 70 nm.

With respect to the length ($LP_L$) of left portion 202, in one embodiment, it is about 40 nm or more and about 200 nm or less. In another embodiment, the length ($LP_L$) of the left portion 202 is about 50 nm or more and about 180 nm or less. In yet another embodiment, the length ($LP_L$) of the left portion 202 is about 60 nm or more and about 150 nm or less. In still yet another embodiment, the length ($LP_L$) of the left portion 202 is about 120 nm.

The length of a set of one removed portion 200 and one left portion 202 may be referred to as a bit line pitch ($BP_L$). The bit line pitch may vary and is not critical to the subject innovation. The patterned first mask layer 202 has any suitable bit line pitch that depends on the desired implementations and/or the memory cell being fabricated. In one embodiment, the bit line pitch is about 60 nm or more and about 350 nm or less. In another embodiment, the bit line pitch is about 80 nm or more and about 310 nm or less. In yet another embodiment, the bit line pitch is about 100 nm or more and about 250 nm or less. In still yet another embodiment, the bit line pitch is about 190 nm.

Figure 3:
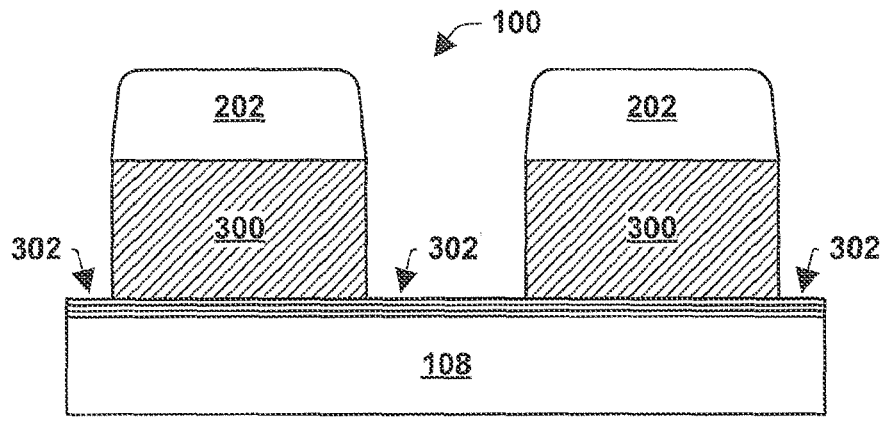
FIG. 3 illustrates patterning the first poly layer by removing exposed portions of the first poly layer that are not covered with the patterned first mask layer, thereby forming a patterned first poly layer and exposing portions of the charge storage layer that are not covered by the patterned first poly layer in accordance with an aspect of the subject innovation.

FIG. 3 illustrates patterning the first poly layer 104 by removing the exposed portions 206 of the first poly layer 104 that are not covered with the patterned first mask layer 202, thereby forming a patterned first poly layer 300 and exposing portions 302 of the charge storage layer 102 that are not covered by the patterned first poly layer 300. The patterned first mask layer 202 can serve as a mask for forming the patterned first poly layer 104.

The exposed portions 206 of the first poly layer 104 can be removed by any suitable technique, for example, etching. For example, the exposed portions 206 of the first poly layer 104 can be removed by contacting the first poly layer 104 with any suitable polysilicon etchant that does not substantially damage and/or remove other components of the semiconductor structure 100 such as the patterned first mask layer 202.

Wet etching and/or dry etching containing isotropic etching and/or anisotropic etching can be employed. Examples of wet etchants include tetraalkylammonium hydroxides (e.g., tetramethylammonium hydroxide (TMAH)) and alkali metal hydroxides (e.g., a potassium hydroxide (KOH) and cerium hydroxide (CeOH)). Examples of dry etching include reactive ion etching using, for example, a mixture gas containing HBr (e.g., HBr and $O_2$ mixture gas, $HBr/NF_3$/He and $O_2$ mixture gas, $SF_6$, HBr and $O_2$ mixture gas). The mixture may further include $Cl_2$. Other polysilicon etchants can also be used as long as they are capable of removing the exposed portions 206 of the first poly layer 104 selective to the patterned first mask layer 202. In one embodiment, when the patterned first mask layer 202 contains nitrides or oxides, the polysilicon etchant has a selectivity of about 1,000:1 or more for polysilicon versus nitrides or oxides. In another embodiment, the polysilicon etchant has a selectivity of about 5,000:1 or more for polysilicon versus nitrides or oxides. While removing the exposed portions 206 of the first poly layer 104, the upper portions of the patterned first mask layer 202 may be removed. As a result, the height of the patterned first mask layer 202 may be reduced.

Figure 4:
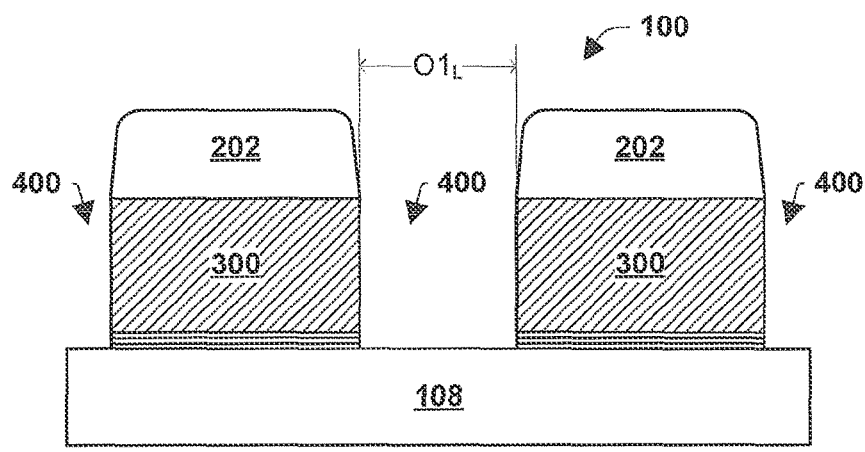
FIG. 4 illustrates removing the exposed portions of the charge storage layer that are not covered by the patterned first poly layer, thereby forming first openings in the patterned first poly layer in accordance with an aspect of the subject innovation.

FIG. 4 illustrates removing the exposed portions 302 of the charge storage layer 102 that are not covered by the patterned first poly layer 300, thereby forming first openings 400 in the patterned first poly layer 300. The first opening 400 is formed at a portion of a second poly gate or a center poly gate of a subsequently formed memory cell.

Since the first opening 400 is formed under the removed portion 200 of the first mask layer 106 (e.g., patterned first mask layer 202) as described in connection with FIG. 2, the length ($O1_L$) of the first opening 400 substantially corresponds to the length ($RP_L$) of the removed portion 200 of the first mask layer 106. The length ($O1_L$) of the first opening 400 can be controlled and/or determined by the length ($RP_L$) of the removed portion 200 of the patterned first mask layer 202. Thus, the length ($O1_L$) of the first opening 400 is the substantially same as the length ($RP_L$) of the removed portion 200 of the patterned first mask layer 202.

The exposed portion 302 of the charge storage layer 102 can be removed by, for example, contacting the exposed portion 302 of the charge storage layer 102 with any suitable etchant under any suitable condition that can remove the exposed portion 302 but does not substantially damage and/or remove other components of the semiconductor structure 100 such as the patterned first poly 300. For example, two or more different etchants can be used to remove the exposed portions 302. Since the exposed potion 302 of the charge storage layer 102 contains the second oxide layer 114, the nitride layer 112, and the first oxide layer 110, any suitable oxide-nitride-oxide etch chemistry can be used. In one embodiment, hydrofluoric acid, phosphoric acid, and hydrofluoric acid are used in sequence to remove the exposed portions 302 of the charge storage layer 102, respectively. In another embodiment, fluorine chemistry (e.g., $CHF_3$, $CF_4$) is used. While removing the exposed potion 302 of the charge storage layer 102, the upper portions of the patterned first mask layer 202 may be removed. As a result, the height of the patterned first mask layer 202 may be reduced.

Figure 5:
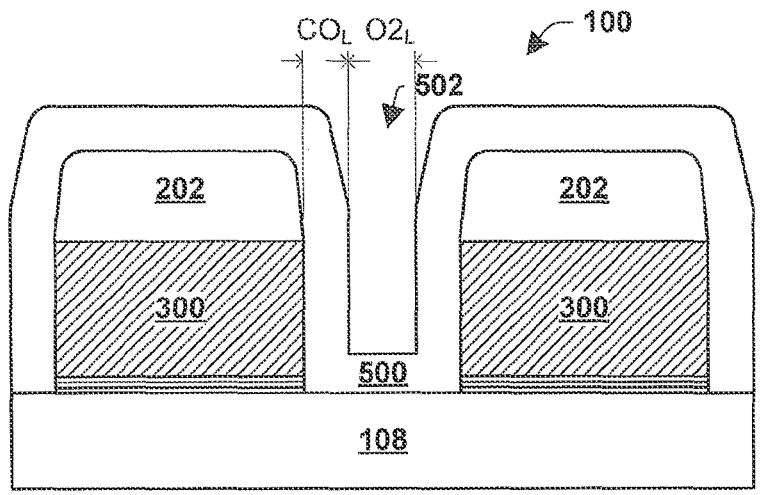
FIG. 5 illustrates forming a center oxide layer over the patterned firs mask layer and the patterned first poly layer and in the first opening, thereby forming a second opening in the first opening in accordance with an aspect of the subject innovation.

FIG. 5 illustrates forming a center oxide layer 500 over the patterned first mask layer 202 and in the first opening 400, thereby forming a second opening 502 in the first opening 400. The center oxide layer 500 can contain any suitable oxide material. Examples of oxides include silicon oxide, high temperature oxide (HTO), high density plasma (HDP)

oxide, and the like. The center oxide layer 500 becomes a dielectric between subsequently formed two split sub-lithographic charge storage nodes of a memory cell in subsequent processes.

In one embodiment, a center oxide layer 500 containing a HTO is formed by a HTO deposition process. For example, the HTO is formed by low pressure chemical vapor deposition (LPCVD) using nitrous oxide ($N_2O$) and dichlorosilane ($SiH_2Cl_2$) gasses at a temperature of about 600 degrees Celsius or more and about 900 degrees Celsius or less and a pressure of about 100 mTorr or more and about 500 mTorr or less. In another embodiment, the center oxide layer 500 is grown in plasma at low temperatures, e.g., plasma-grown oxide. For example, the oxide layer contains plasma-grown oxide that is grown at a temperature of about 250 degrees Celsius or more and about 600 degrees Celsius or less. The oxide layer may be formed by a HDP deposition process. In yet another embodiment, the center oxide layer 500 is formed using a Slot Plane Antenna (SPA) process. In the SPA process, plasma-grown oxide is grown in a chamber that includes a microwave slot antenna, which is used to generate the plasma. The microwave slot antenna can be configured to provide a plasma distribution that results in a plasma-grown oxide that has increased uniformity, conformity, and quality compared to conventional plasma oxide. In the SPA process, the species used to grow the oxide can contain one or more of oxygen, argon, or hydrogen, for example. The center oxide layer 500 can be optionally subjected to an anneal in, for example, a nitrogen ambient at about 1000 degrees Celsius for thirty minutes.

In one embodiment, the center oxide layer 500 does not completely fill the first opening 400, and after forming the center oxide layer 500, there is a second opening 502 in the first opening 400. The second opening 502 can have any suitable length that depends on, for example, the desired length of a subsequently formed second poly gate, the desired implementations and/or the memory cell being fabricated. The length ($O2_L$) of the second opening 502 is generally equal to the length ($O1_L$) of first opening 400 minus twice the length ($CO_L$) of the center oxide layer 500. In one embodiment, the length ($O2_L$) of the second opening 502 is about 10 nm or more and about 100 nm or less. In another embodiment, the length ($O2_L$) of the second opening 502 is about 15 nm or more and about 70 nm or less. In yet another embodiment, the length ($O2_L$) of the second opening 502 is about 20 nm or more and about 50 nm or less. In still yet another embodiment, length ($O2_L$) of the second opening 502 is about 30 nm. In another embodiment, the center oxide layer 500 fills the first opening 400 and there is no opening in the first opening 400 (not shown).

The center oxide layer 500 can have any suitable length ($CO_L$) that depends on, for example, the desired length of second opening, the desired implementations and/or the memory cell being fabricated. In one embodiment, the length ($CO_L$) of the center oxide layer 500 is about 5 nm or more and about 50 nm or less. In another embodiment, the length ($CO_L$) of the center oxide layer 500 is about 10 nm or more and about 40 nm or less. In yet another embodiment, the length ($CO_L$) of the center oxide layer 500 is about 15 nm or more and about 30 nm or less. In still yet another embodiment, the length ($CO_L$) of the center oxide layer 500 is about 20 nm.

Figure 6:
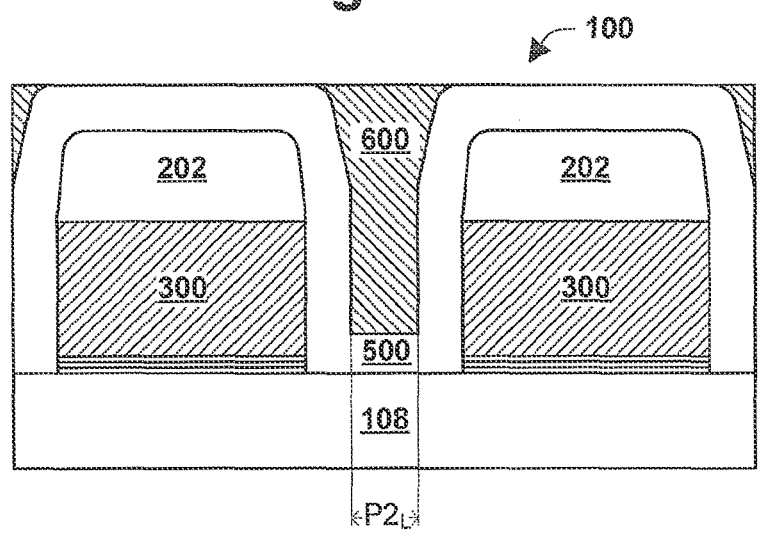
FIG. 6 illustrates forming a second poly gate in the second opening in accordance with an aspect of the subject innovation.

FIG. 6 illustrates forming a second poly gate 600 in the second opening 502. The second poly gate 600 may be referred to as a center poly gate. The second poly gate 600 typically contains polysilicon. The second poly gate 600 can be formed in the second opening 502 by, for example, forming a second poly layer over the semiconductor substrate 108 via CVD and etching back the second poly layer to the surface of the center oxide layer 500. The upper surface of the second poly gate 600 may be substantially coplanar with the upper surface of the center oxide layer 500. That is, the upper surface of the second poly gate 600 is higher than the upper surface of the patterned first mask layer 202 by the height of the center oxide layer 500. When the center oxide layer 500 fills the first opening 400 and there is no opening in the first opening 400, a second poly gate is not formed (not shown).

The second poly gate 600 can have any suitable length ($P2_L$) that depends on, for example, the desired implementations and/or the memory cell being fabricated. When the upper corners of the patterned first mask layer 202 are rounded and/or the patterned first mask layer 202 has relatively sloping side surfaces 204 that extend perpendicular to the topological surface of the semiconductor substrate 108, the length of the upper portion of the second poly gate 600 may be greater than the length of the lower portion of the second poly gate 600. When the upper corners of the patterned first mask layer 202 are not rounded and/or the patterned first mask layer 202 has relatively vertical side surfaces 204 to the topological surface of the semiconductor substrate 108, the length of the upper portion of the second poly gate 600 may be substantially equal to the length of the lower portion of the second poly gate 600 (not shown).

In one embodiment, the length ($P2_L$) of the second poly gate 600 (e.g., the length of the lower portion of the second poly gate 600) is about 10 nm or more and about 100 nm or less. In another embodiment, the length ($P2_L$) of the second poly gate 600 is about 15 nm or more and about 70 nm or less. In yet another embodiment, the length ($P2_L$) of the second poly gate 600 is about 20 nm or more and about 50 nm or less. In still yet another embodiment, the length ($P2_L$) of the second poly gate 600 is about 30 nm.

Figure 7:
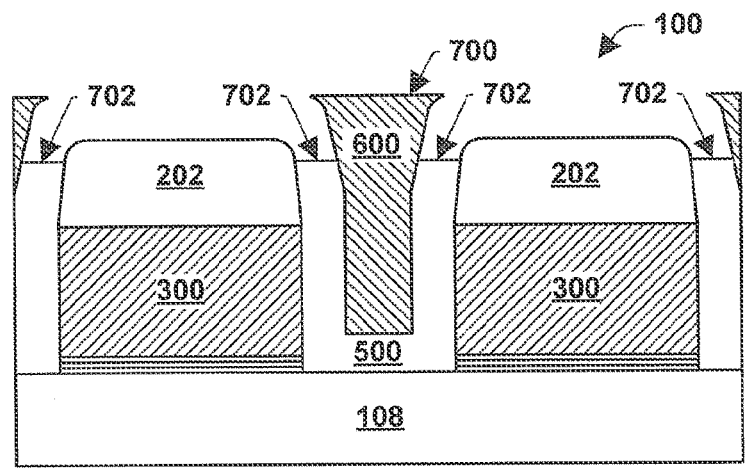
FIG. 7 illustrates removing portions of the center oxide layer around the patterned first mask layer, thereby exposing the upper portion of the patterned first mask layer and the upper portion of the second poly gate in accordance with an aspect of the subject innovation.

FIG. 7 illustrates removing portions of the center oxide layer 500 around the patterned first mask layer 202, thereby exposing the upper portion of the patterned first mask layer 202, the upper portion 700 of the second poly gate 600, and the upper surface 702 of the resultant center oxide layer 500. The portions of the center oxide layer 500 can be removed by any suitable technique. For example, the portions of the center oxide layer 500 can be removed by contacting the center oxide layer 500 with any suitable oxide etchant. Examples of oxide etchants include halogen acids such as hydrofluoric acid.

Any suitable amount of the portions of the center oxide layer 500 around the patterned first mask layer 202 can be removed. In one embodiment, the upper surface 702 of the resultant center oxide layer 500 is lower than the upper surface of the patterned first mask layer 202. In one embodiment, the upper surface 702 of the resultant center oxide layer 500 is lower than the upper surface of the patterned first mask layer 202 by about 3 nm or more and about 30 nm or less. In another embodiment, the upper surface 702 of the resultant center oxide layer 500 is lower than the upper surface of the patterned first mask layer 202 by about 5 nm or more and about 20 nm or less. In yet another embodiment, the upper surface 702 of the resultant center oxide layer 500 is lower than the upper surface of the patterned first mask layer 202 by about 10 nm.

Figure 8:
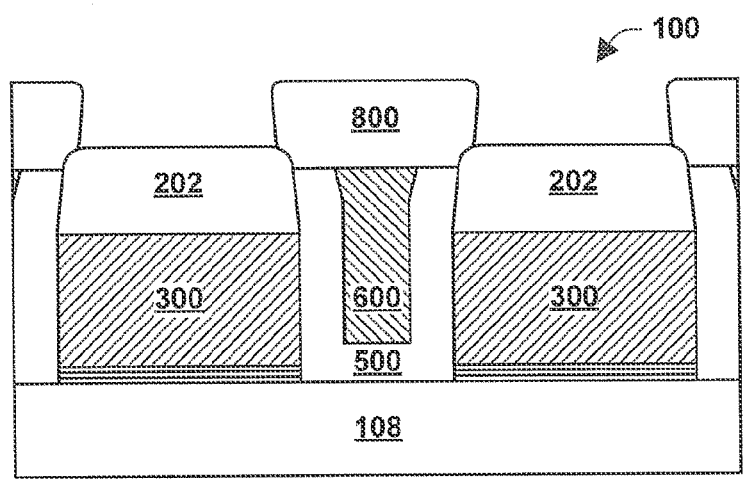
FIG. 8 illustrates oxidizing the upper portion of the second poly gate, thereby forming a silicon oxide portion in accordance with an aspect of the subject innovation.

FIG. 8 illustrates oxidizing the upper portion 700 of the second poly gate 600, thereby forming a silicon oxide portion 800. The upper portion 700 of the second poly gate 600 may be a portion of the second poly gate 600 that is exposed/revealed by removing the portions of the center oxide layer 500 as described in connection with FIG. 7. By oxidizing the upper portion 700 of the second poly gate 600, the resultant silicon oxide portion 800 may be in a mushroom shape.

The silicon oxide portion 800 of the second poly gate 600 can be formed by any suitable technique. For example, the silicon oxide portion 800 is formed by thermal oxidation, plasma oxidation, liquid chemical oxidation, combinations thereof, and the like. In the thermal oxidation, the upper portion 700 of the second poly gate 600 is oxidized at elevated temperatures in an $O_2$ atmosphere. In one embodiment, the upper portion 700 of the second poly gate 600 is oxidized at about 600 degrees Celsius or more and about 800 degrees Celsius or less. In the plasma oxidation, the upper portion 700 of the second poly gate 600 is oxidized by using a plasma gas containing oxygen ($O_2$), ozone ($O_3$), nitrous oxide ($N_2O$), or the like at a temperature of about 200 degrees Celsius or more and about 600 degrees Celsius or less. A HDP process or SPA process may be employed to oxidize the upper portion 700 of the second poly gate 600. In the liquid chemical oxidation, the upper portion 700 of the second poly gate 600 is contacted with, for example, a liquid mixture of sulfuric acid and hydrogen peroxide water; ozone water; and the like at a temperature of about 10 degrees Celsius or more and about 600 degrees Celsius or less. These oxidation processes may be employed individually or in combination. For example, after the plasma oxidation is performed, the liquid chemical processing can be performed.

In one embodiment, the upper portion 700 of the second poly gate 600 is oxidized by a low temperature oxidation process such as a low temperature radical oxidation, a low temperature plasma oxidation process, and the like. The low temperature oxidation may advantageously not change the electrical properties of components/layer of the memory device 1000. For example, the low temperature oxidation does advantageously not change the doping profile of implanted regions in the semiconductor substrate 108. Any suitable oxygen reactant can be employed in the low temperature oxidation process. For example, atomic oxygen, ozone, ionized oxygen radicals produced in a plasma can be employed. In one embodiment, the upper portion 700 of the second poly gate 600 is oxidized at a temperature of about 200 degrees Celsius or more and about 600 degrees Celsius or less. In another embodiment, the upper portion 700 of the second poly gate 600 is oxidized at a temperature of about 220 degrees Celsius or more and about 550 degrees Celsius or less. In yet another embodiment, the upper portion 700 of the second poly gate 600 is oxidized at a temperature of about 240 degrees Celsius or more and about 500 degrees Celsius or less.

By oxidizing the upper portion 700 of the second poly gate 600, the resultant silicon oxide portion 800 may expand in the lateral direction and/or in the vertical direction. In one embodiment, the resultant silicon oxide portion 800 expands in the lateral direction, and the silicon oxide portion 800 is formed on the upper surface 702 of the center oxide layer 500 and/or around the upper corner of the patterned first mask layer 202.

In another embodiment, the resultant silicon oxide portion 800 expands in the vertical direction. The height of the silicon oxide portion 800 may vary and is not critical to the subject innovation. The silicon oxide portion 800 has any suitable height that depends on the desired implementations and/or the memory cell being fabricated. In one embodiment, the height of the silicon oxide portion 800 is about 20 nm or more and about 250 nm or less. In another embodiment, the height of the silicon oxide portion 800 is about 30 nm or more and about 150 nm or less. In yet another embodiment, the height of the silicon oxide portion 800 is about 50 nm or more and about 100 nm or less. In still yet another embodiment, the height of the silicon oxide portion 800 is about 70 nm.

Figure 9:
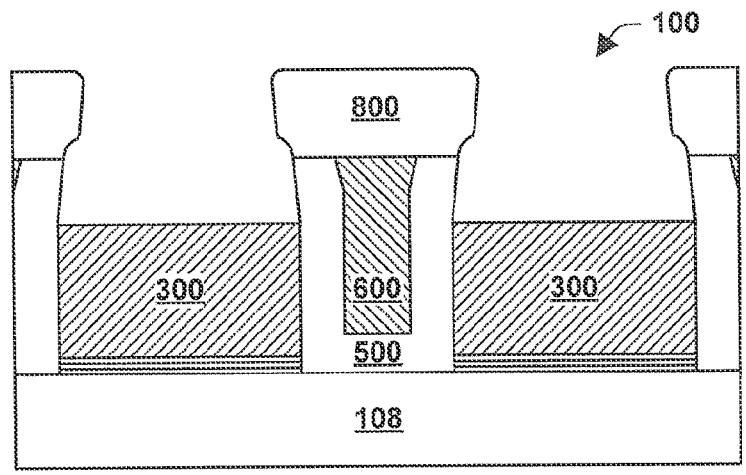
FIG. 9 illustrates removing the patterned first mask layer on the patterned first poly layer in accordance with an aspect of the subject innovation.

FIG. 9 illustrates removing the patterned first mask layer 202 on the patterned first poly layer 300. The patterned first mask layer 202 can be removed by any suitable technique, for example, etching. For example, the patterned first mask layer 202 can be removed by contacting the patterned first mask layer 202 with any suitable etchant that does not substantially damage and/or remove other components of the semiconductor structure 100 such as the center oxide layer 500 and the silicon oxide portion 800. When the patterned first mask layer 202 contains nitrides, nitride etchants can be employed to remove the patterned first mask layer 202. Examples of nitride etchants include phosphoric acid.

Figure 10:
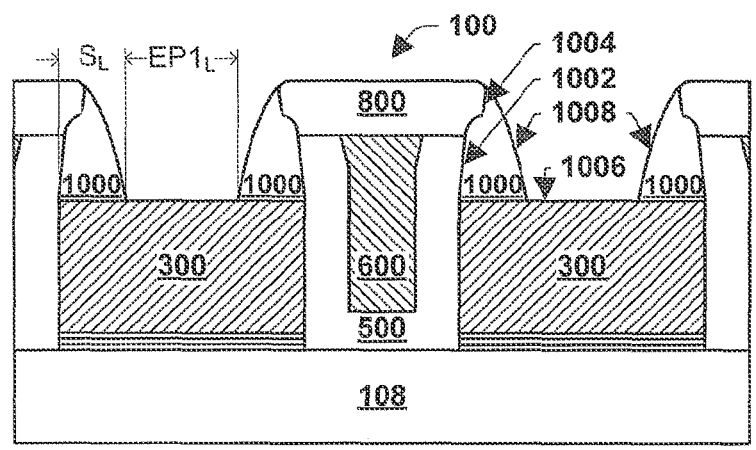
FIG. 10 illustrates forming spacers adjacent the side surface of the center oxide layer and/or the side surface of the silicon oxide portion and on portions of the upper surface of the patterned first poly layer in accordance with an aspect of the subject innovation.

FIG. 10 illustrates forming spacers 1000 adjacent the side surface 1002 of the center oxide layer 500 and/or the side surface 1004 of the silicon oxide portion 800 and on portions of the upper surface of the patterned first poly layer 300. In this example, the spacer 1000 is formed over the side surface 1002 of the center oxide layer 500 and the side surface 1004 of the silicon oxide portion 800 and on portions of the upper surface of the patterned first poly layer 300. In another embodiment, the spacer 1000 is formed over only the side surface 1002 of the center oxide layer 500 and on portions of the upper surface of the patterned first poly layer 300 (not shown). The spacers 1000 can serve as a mask for forming sub-lithographic first poly gates and charge storage nodes in subsequent processes. The patterned first poly layer 300 has exposed portions 1006 that are not covered with the spacers 1000. The exposed portion 1006 is between the sloping side surfaces 1008 (e.g., outer surface) of the spacers 1000.

The spacer 1000 can contain any suitable material so that the spacer 1000 can serve as a mask for protecting the covered portion of the patterned first poly layer 300 when removing unmasked portions (e.g., exposed portions 1006) of the patterned first poly layer 300. That is, the spacer material can be selected so that there is etch selectivity between the spacer 1000 and the patterned first poly layer 300.

The spacer material can have a lower etch rate than the patterned first poly layer 300 in a subsequent etching process. For example, an etching rate of a nitride material is markedly slower than an etching rate of polysilicon with respect to a polysilicon etchant. Accordingly, in one embodiment, the spacer 1000 contains nitride materials when the patterned first poly layer 300 contains polysilicon. Examples of nitride materials include silicon oxynitride, silicon nitride, and the like. In another embodiment, diamond-like carbon and/or silicon carbide can be employed as a spacer 1000.

The spacer 1000 can be formed by any suitable method, for example, forming a layer containing the spacer material over the substrate 108 and then removing portions of the spacer material layer not near the side surfaces 1002, 1004 of the center oxide layer 500 and/or the silicon oxide portion 800 to leave the spacer 1000. A layer containing the spacer material can be formed at least over the side surfaces 1002, 1004 of the center oxide layer 500 and/or the silicon oxide portion 800. For example, the spacer material layer can be formed by depositing a silicon nitride layer over the side surfaces 1002, 1004 of the center oxide layer 500 and/or the silicon oxide portion 800 and over the patterned first poly layer 300 by CVD.

After forming the spacer material layer, portions of the spacer material layer can be removed by, for example, etching, thereby forming a spacer 1000. Any suitable etching can be used as long as the etching can leave a spacer 1000 adjacent the side surfaces 1002, 1004 of the center oxide layer 500 and/or the silicon oxide portion 800 and on a portion of the upper surface of the patterned first poly layer 300. Examples of etching include reactive ion etching, chemical plasma etching, or other suitable anisotropic etching utilizing a suitable chemistry.

Choice of a suitable process and reagents of etching depends on, for example, the spacer material, the length and height of the spacer material, the desired implementations and/or the memory cell being fabricated, and the like. In one embodiment, reactive ion etching is used with an appropriate etchant for the selected spacer material. For example, when the spacer 1000 contains silicon nitrides, examples of etchants include $CF_4$ or $CHF_3$. In another embodiment, when the spacer 1000 contains diamond-like carbon, examples of etchants include oxygen-based plasma. In yet another embodiment, when the spacer 1000 contains silicon carbides, examples of etchants include $CF_4$, $CH_2F_2$, or $C_2F_6$. The height of the silicon oxide portion 800 may be reduced during the spacer forming process.

The spacer 1000 can serve as a mask for protecting a narrow portion of the patterned first poly layer 300 and the charge storage layer 102 when removing the exposed portions 1006 of the patterned first poly layer 300 and the charge storage layer 102 in subsequent processes as described below. As a result, the length ($S_L$) of the spacer 1000 can control and/or determine a length of the resultant sub-lithographic first poly gate and charge storage node. That is, the length of the spacer 1000 substantially corresponds to the length of the subsequently formed sub-lithographic first poly gate and charge storage node.

The spacer 1000 can have any suitable length ($S_L$) that depends on, for example, the desired length of the sub-lithographic charge storage node, the desired implementations and/or the memory cell being fabricated, and the like.

In one embodiment, the spacer 1000 has a length ($S_L$) of about 5 nm or more and about 50 nm or less. In another embodiment, the spacer 1000 has a length (SL) of about 10 nm or more and about 40 nm or less. In yet another embodiment, the spacer 1000 has a length ($S_L$) of about 15 nm or more and about 35 nm or less. In still yet another embodiment, the spacer 1000 has a length ($S_L$) of about 30 nm.

The exposed portions 1006 of the patterned first poly layer 300 that are not covered with the spacer 1000 are removed to form a bit line opening in subsequent processes, and a bit line is formed in the semiconductor substrate 108 under the bit line opening in subsequent processes. As a result, the length ($EP1_L$) of the exposed portion 1006 of the patterned first poly layer 300 that is not covered with the spacer 1000 can control and/or determine a length of the resultant bit line opening. That is, the length ($EP1_L$) of the exposed portion 1006 of the patterned first poly layer 300 substantially corresponds to the length of the subsequently formed bit line opening.

The exposed portion 1006 of the patterned first poly layer 300 can have any suitable length ($EP1_L$) that depends on, for example, the desired length of the sub-lithographic charge storage node, the desired implementations and/or the memory cell being fabricated, and the like. In one embodiment, the exposed portion 1006 has a length ($EP1_L$) of about 5 nm or more and about 190 nm or less. In another embodiment, the exposed portion 1006 has a length ($EPI_L$) of about 20 nm or more and about 100 nm or less. In yet another embodiment, the exposed portion 1006 has a length ($EP1_L$) of about 30 nm or more and about 70 nm or less. In still yet another embodiment, the exposed portion 1006 has a length ($EP1_L$) of about 50 nm.

Figure 11:
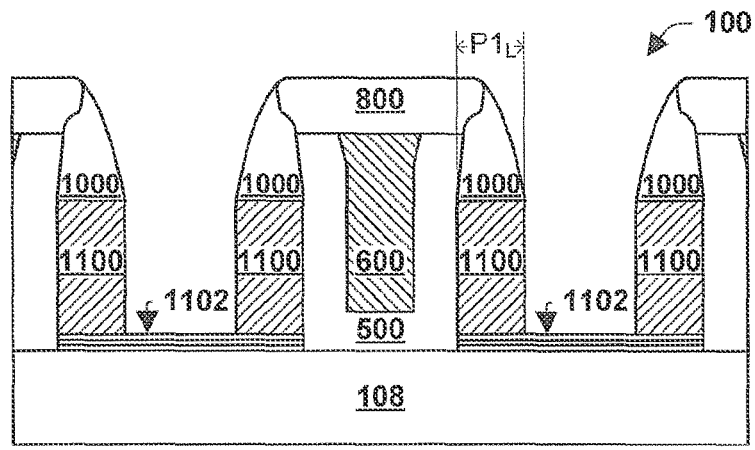
FIG. 11 illustrates removing exposed portions of the patterned first poly layer, thereby forming two split sub-lithographic first poly gates and exposing portions of the charge storage layer that are not covered by the spacers in accordance with an aspect of the subject innovation.

FIG. 11 illustrates removing the exposed portions 1006 of the patterned first poly layer 300, thereby forming two split sub-lithographic first poly gates 1100 and exposing portions 1102 of the charge storage layer 102 that are not covered by the sub-lithographic first poly gates 1100. The spacer 1000 can serve as a mask for forming the sub-lithographic first poly gate 1100.

The exposed portions 1006 of the patterned first poly layer 300 can be removed by any suitable technique, for example, etching. For example, the exposed portions 1006 of the patterned first poly layer 300 can be removed in the same manner as described above for removing the exposed portions 206 of first poly layer 104 in connection with FIG. 3. The height of the silicon oxide portion 800 and/or the spacer 1000 may be reduced during the etching process.

The sub-lithographic first poly gate 1100 can have any suitable length ($P1_L$) that depends on, for example, the desired length of bit line pitch, the desired implementations and/or the memory cell being fabricated. The length ($P1_L$) of the sub-lithographic first poly gate 1100 substantially corresponds to the length ($S_L$) of the spacer 1000. In one embodiment, the sub-lithographic first poly gate 1100 has a length ($P1_L$) of about 5 nm or more and about 50 nm or less. In another embodiment, the sub-lithographic first poly gate 1100 has a length ($P1_L$) of about 10 nm or more and about 40 nm or less. In yet another embodiment, the sub-lithographic first poly gate 1100 has a length ($P1_L$) of about 15 nm or more and about 35 nm or less. In still yet another embodiment, the sub-lithographic first poly gate 1100 has a length ($P1_L$) of about 35 nm.

Figure 12:
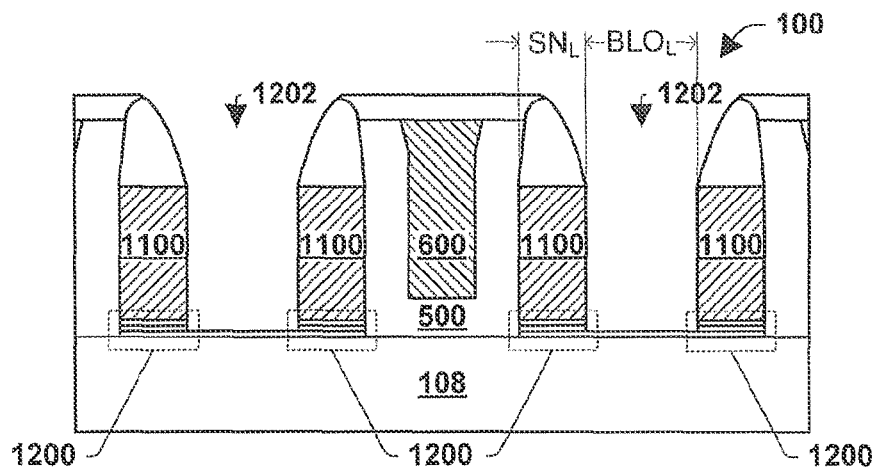
FIG. 12 illustrates removing at least portion of exposed portions of the charge storage layer, thereby forming two split sub-lithographic charge storage nodes and a bit line opening on the semiconductor substrate in accordance with an aspect of the subject innovation.

FIG. 12 illustrates removing at least a portion of exposed portions 1102 of the charge storage layer 102, thereby forming two split sub-lithographic charge storage nodes 1200 and a bit line opening 1202 on the semiconductor substrate 108. The exposed portions 1102 of the charge storage layer 102 are not covered by the spacer 1000 and the sub-lithographic first poly gates 1100. The bit line opening 1202 is formed between the sloping side surfaces 1008 (e.g., outer surface) of the spacers 1000. A bit line is formed in the semiconductor substrate 108 under the bit line opening 1202 in a subsequent process.

In one embodiment, a portion of the exposed portion 1102 of the charge storage layer 102 is removed, and the rest of the exposed portion 1102 of the charge storage layer 102 remains on the semiconductor substrate 108. For example, the second oxide layer 114, the nitride layer 112, and an upper portion of the first oxide layer 110 of the exposed portion 1102 of the charge storage layer 102 are removed, and the rest of the first oxide layer 110 having a height of, for example, about 10 nm or more and about 20 nm or less remains. In another embodiment, substantially all of the exposed portions 1102 of the charge storage layer 102 are removed (not shown).

The exposed portion 1102 of charge storage layer 102 can be removed by any suitable technique. The exposed potion 1102 of charge storage layer 102 can be removed by, for example, contacting the exposed portion 1102 of the charge storage layer 102 with any suitable etchant under any suitable condition that can remove the exposed portion 1102 of the charge storage layer 102 but does not substantially damage and/or remove other components of the semiconductor structure 100 such as the sub-lithographic first poly gates 1100. For example, two or more different etchants can be used to remove the exposed portions 1102 of the charge storage layer 102. Since the exposed potion 1102 of the charge storage layer 102 contains the second oxide layer 114, the nitride layer 112, and the first oxide layer 110, any suitable oxide-nitride-oxide etch chemistry can be used. In one embodiment, hydrofluoric acid, phosphoric acid, and hydrofluoric acid are used in sequence to remove the three layers, respectively. In another embodiment, fluorine chemistry (e.g., $CHF_3$, $CF_4$) is used. When removing the exposed portion 1102 of the charge storage layer 102, upper portions of the silicon oxide portion 800 and the spacer 1000 may be removed. As a result, the heights of the silicon oxide portion 800 and/or the spacer 1000 may be reduced.

The length ($SN_L$) of the sub-lithographic charge storage node 1200 can be controlled and/or determined primarily by the specific identity of the spacer material and/or the length ($S_L$) of the spacer 1000. The sub-lithographic charge storage node 1200 can have any suitable length ($SN_L$) that depends on, for example, the desired bit line pitch, the desired implementations, and/or the memory cell being fabricated. In one embodiment, the sub-lithographic charge storage node 1200 has a length ($SN_L$) of about 5 nm or more and about 50 nm or less. In another embodiment, the sub-lithographic charge storage node 1200 has a length ($SN_L$) of about 10 nm or more and about 40 nm or less. In yet another embodiment, the sub-lithographic charge storage node 1200 has a length ($SN_L$) of about 15 nm or more and about 35 nm or less. In still yet another embodiment, the sub-lithographic charge storage node 1200 has a length ($SN_L$) of about 30 nm.

The bit line opening 1202 can have any suitable length ($BLO_L$) that depends on, for example, the desired bit line pitch, the desired length of the sub-lithographic charge storage node, the desired implementations, and/or the memory cell being fabricated. In one embodiment, the bit line opening 1202 has a length ($BLO_L$) of about 5 nm or more and about 190 nm or less. In another embodiment, the bit line opening 1202 has a length ($BLO_L$) of about 20 nm or more and about 100 nm or less. In yet another embodiment, the bit line opening 1202 has a length ($BLO_L$) of about 30 nm or more and about 70 nm or less. In still yet another embodiment, the bit line opening 1202 has a length ($BLO_L$) of about 50 nm.

Figure 13:
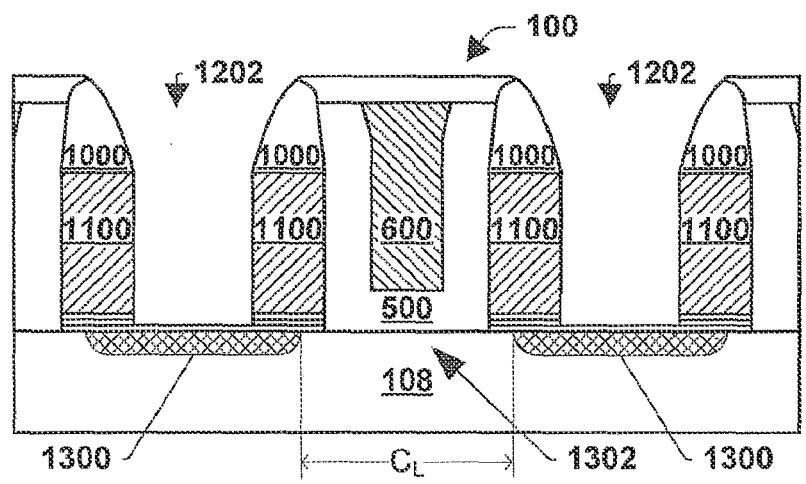
FIG. 13 illustrates implanting portions of the semiconductor substrate through the bit line opening, thereby forming implanted portions (e.g., bit line) in the semiconductor substrate in accordance with an aspect of the subject innovation.

FIG. 13 illustrates implanting portions of the semiconductor substrate 108 through the bit line opening 1202, thereby forming implanted portions (e.g., bit line) 1300 in the semiconductor substrate 108. The implanted portions 1300 can be formed in the semiconductor substrate 108 by any suitable implantation technique such as doping the substrate 108 with implant species (e.g., arsenic, antimony, phosphorus, boron, and argon). For example, a double diffusion implant (DDI) and a medium diffused drain (MDD) implant can be formed in the substrate 108. When the first oxide layer 110 remains at the bottom of the bit line opening 1202, the implant species can be implanted through the first oxide layer 110 into the semiconductor substrate 108. In this embodiment, the sub-lithographic first poly gate 1100 and center oxide layer 500 serve as an implant screen. As a result of the implantation, when the semiconductor structure 100 is a portion of a non-volatile memory device, the implanted portion of the substrate 108 may be referred to as a source region or a drain region, and some areas of the unimplanted portion 1302 of the substrate 108 (e.g., under the center oxide 500) may be referred to as a channel.

The length of unimplanted portion 1302 may be referred to as a channel length ($C_L$). The unimplanted portion 1302 can have any suitable channel length ($C_L$) that depends on, for example, the desired bit line pitch, the desired implementations, and/or the memory cell being fabricated. In one embodiment, the channel length ($C_L$) is about 40 nm or more and about 200 nm or less. In another embodiment, the channel length ($C_L$) is about 60 nm or more and about 150 nm or less. In yet another embodiment, the channel length ($C_L$) is about 70 nm or more and about 120 nm or less. In still yet another embodiment, the channel length ($C_L$) is about 100 nm.

Figure 14:
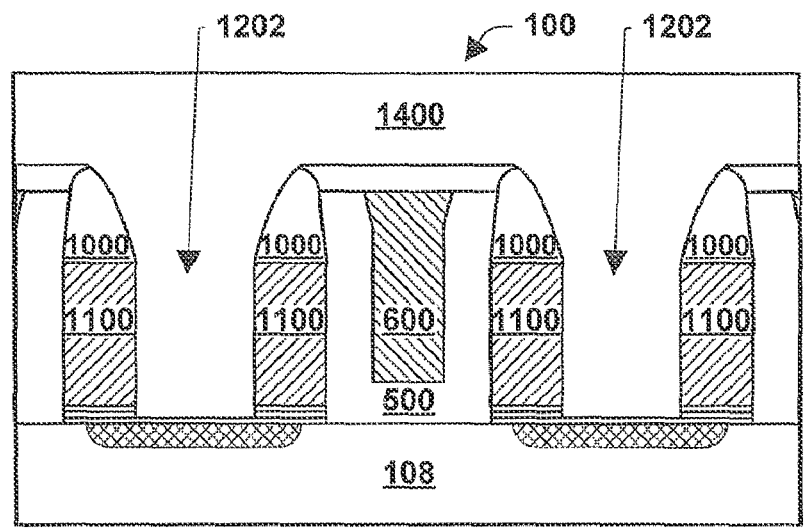
FIG. 14 illustrates forming a bit line dielectric in the bit line opening on the semiconductor substrate in accordance with an aspect of the subject innovation.

FIG. 14 illustrates forming a bit line dielectric 1400 in the bit line opening 1202 on the semiconductor substrate 108. The bit line dielectric 1400 can contain any suitable dielectric material such as oxides. Examples of oxides include silicon oxide, HTO, HDP oxide, and the like. The bit line dielectric 1400 can be formed any suitable technique. For example, the bit line dielectric 1400 is formed in the same manner as described above for forming the center oxide layer 500 in connection with FIG. 5.

Figure 15:
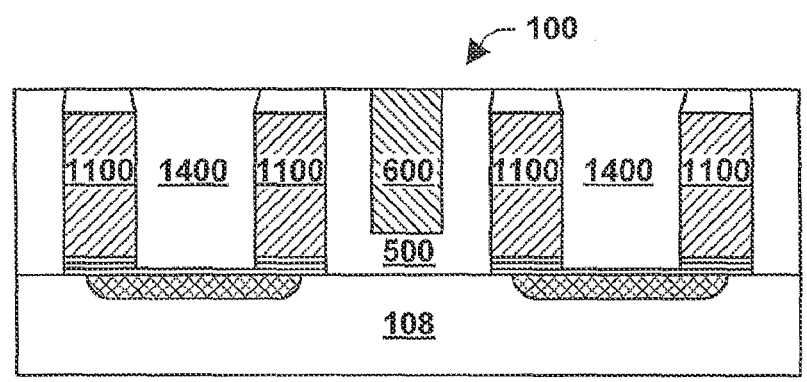
FIG. 15 illustrates removing the silicon oxide portion and upper portions of the bit line dielectric, the second poly gate, and the spacer in accordance with an aspect of the subject innovation.

FIG. 15 illustrates removing the silicon oxide portion 800 and upper portions of the second poly gate 600, the spacer 1000, and the bit line dielectric 1400. The upper portions can be removed any suitable technique. For example, the upper portions are removed by chemical-mechanical polishing (CMP). For example, the upper portions are polished by CMP under any suitable condition to facilitate removing/polishing the upper portions. The conditions generally depend upon, for example, the height of the bit line dielectric, the composition of the bit line dielectric, the desired implementations and/or the memory cell being fabricated, and the like.

Figure 16:
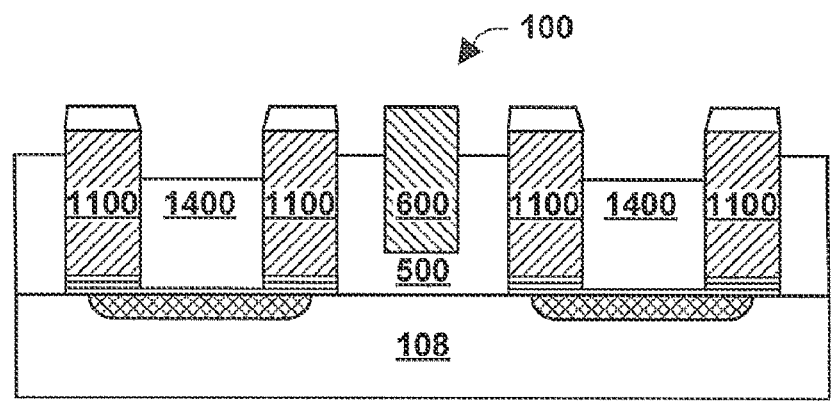
FIG. 16 illustrates further removing the upper portion of the bit line dielectric in accordance with an aspect of the subject innovation.

FIG. 16 illustrates further removing the upper portion of the bit line dielectric 1400, thereby exposing the upper portion of the sub-lithographic first poly gate 1100. In one embodiment, the upper portion of the center oxide 500 is removed at the same time that the upper portion of the bit line dielectric 1400 is removed. The upper portion of the bit line dielectric 1400 can be removed any suitable technique. For example, the upper portion of the bit line dielectric 1400 is removed by etching. The upper portion of the bit line dielectric 1400 can be removed by contacting the upper portion with any suitable etchant under any suitable condition that can remove the upper portion of the bit line dielectric 1400 but does not substantially damage and/or remove other components of the semiconductor structure 100 such as the sub-lithographic first poly gate 700 and second poly gate 600. When the bit line dielectric 1400 contains oxides, any suitable oxide etchant such as halogen acids (e.g., hydrofluoric acid) can be employed.

Figure 17:
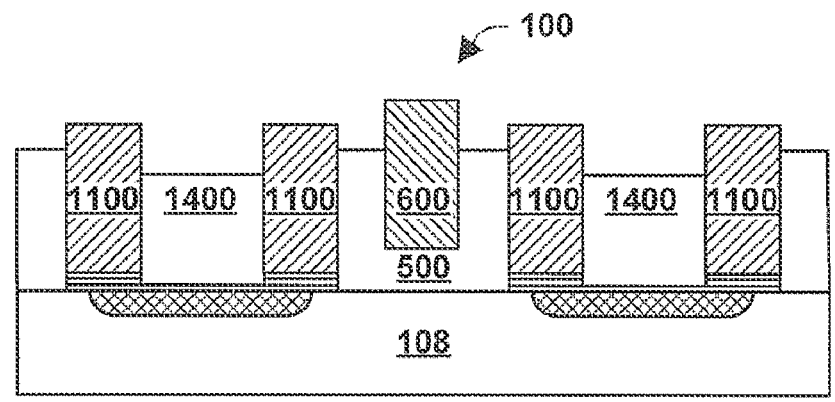
FIG. 17 illustrates removing the spacer on the semiconductor substrate, thereby exposing the upper surface of the sub-lithographic first poly gate in accordance with an aspect of the subject innovation.

FIG. 17 illustrates removing the spacer 1000 on the semiconductor substrate 108, thereby exposing the upper surface of the sub-lithographic first poly gate 1100. The spacer 1000 can be removed by any suitable technique. For example, the spacer 1000 can be removed by contacting the spacer 1000 with any suitable etchant. When the spacer 1000 contains nitrides, the spacer 1000 is removed by contacting the spacer 1000 with any suitable nitride etchant. Examples of nitride etchants include phosphoric acid. The spacer 1000 is contacted with a suitable nitride etchant under conditions that the etchant does not substantially remove and/or damage other components of the semiconductor structure 100 such as the sub-lithographic first poly gates 1100 and second poly gate 600.

Figure 18:
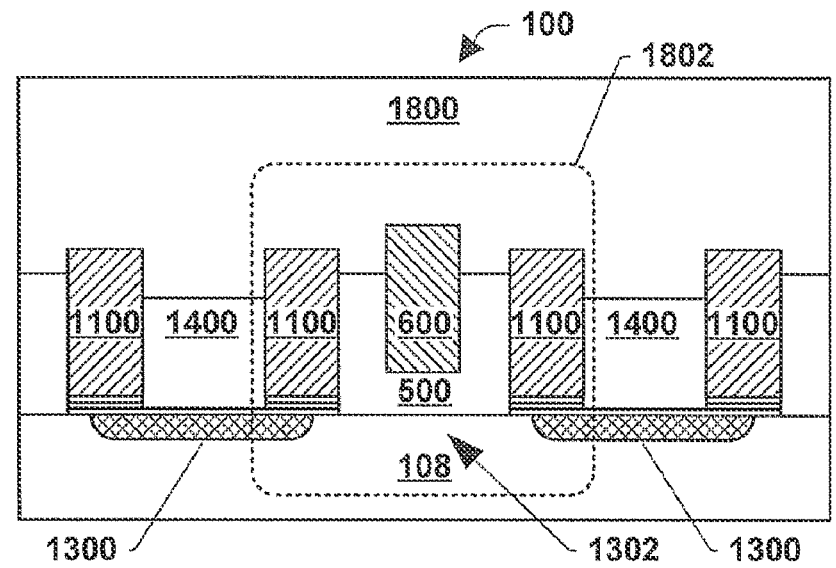
FIG. 18 illustrates forming a third poly gate over the semiconductor substrate, thereby forming a memory cell in accordance with an aspect of the subject innovation.

FIG. 18 illustrates forming a third poly gate 1800 over the semiconductor substrate 108, thereby forming a memory cell 1802. The memory cell 1802 is separated from adjacent memory cells by the bit line dielectric 1400 in the bit line opening 1202. The third poly gate 1800 typically contains polysilicon. The height of the third poly gate 1800 may vary and is not critical to the subject innovation. The third poly gate 1800 has any suitable height that depends on the desired implementations and/or the memory cell being fabricated. In one embodiment, the height of the third poly gate 1800 is about 30 nm or more and about 300 nm or less. In another embodiment, the height of the third poly gate 1800 is about 50 nm or more and about 200 nm or less. In yet another embodiment, the height of the third poly gate 1800 is about 70 nm or more and about 150 nm or less. In still yet another embodiment, the height of the third poly gate 1800 is about 100 nm.

The memory cell 1802 contains the two split sub-lithographic charge storage nodes 1200 on the semiconductor substrate 108; the center oxide layer 500 between the two split sub-lithographic charge storage nodes 1200; the implanted portions 1300 of the semiconductor substrate 108 under the two split sub-lithographic charge storage nodes 1200; the two split sub-lithographic first poly gates 1100 on the two split sub-lithographic charge storage nodes 1200; the second poly gate 600 between the two split sub-lithographic first poly gates 1100; and the third poly gate 1800 over the two split sub-lithographic charge storage nodes 1200. Since the memory cell 1802 has the two split sub-lithographic charge storage nodes 1200 separated by the center oxide layer 500, the memory cell 1802 can store two physically distinct bits. Each bit within the memory cell 1802 serves as a binary unit of data (e.g., either 1 or 0) that can be mapped directly to a memory array. Reading or programming one side of sub-lithographic charge storage nodes 1200 occurs independently of whatever data is stored on the opposite side of the sub-lithographic charge storage nodes 1200. Moreover, the third oxide 900 can prevent and/or mitigate undesirable signal crossover (e.g., crosstalk) between the two split sub-lithographic charge storage nodes 1200. As a result, the memory cell 1802 can provide exceptional read and write performance.

Figure 19:
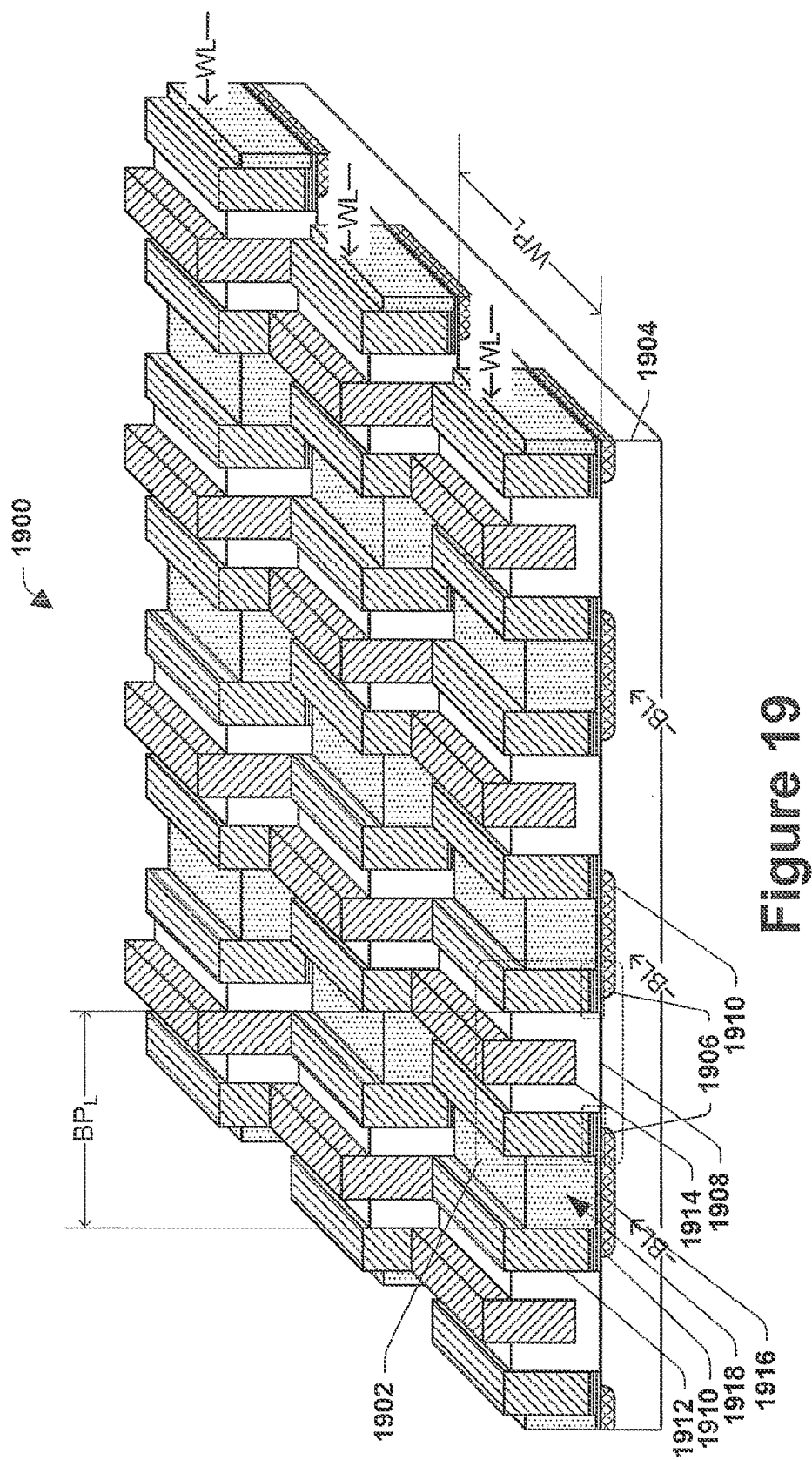
FIG. 19 illustrates a perspective view of a portion of another exemplary semiconductor structure containing two or more memory cells having two split sub-lithographic charge storage nodes on a semiconductor substrate in accordance with an aspect of the subject innovation.

FIG. 19 illustrates a perspective view of a portion of a semiconductor structure 1900 containing two or more memory cells 1902 on a semiconductor substrate 1904. The semiconductor structure 1900 can contain any suitable number of the memory cells 1902 in an array with rows as indicated by arrows WL (e.g., word lines) and columns as indicated by arrows BL (e.g., bit lines). The memory cell 1902 contains two split sub-lithographic charge storage nodes 1906 containing, for example, a first insulating layer, a charge storage dielectric layer, and a second insulating layer; a dielectric 1908 (e.g., center oxide) between the two split sub-lithographic charge storage nodes 1906; implanted portions 1910 of the semiconductor substrate 1904 under the two split sub-lithographic charge storage nodes 1906; two split sub-lithographic first poly gates 1912 on the two split sub-lithographic charge storage nodes 1906; a second poly gate 1914 between the two split sub-lithographic charge storage nodes 1906; and a third poly gate (not shown) over the two split sub-lithographic charge storage nodes 1906. The two or more memory cells 1902 are separated by a bit line dielectric 1916 in a bit line opening 1918.

The bit line pitch ($BP_L$) may vary and is not critical to the subject innovation. Any suitable bit line pitch can be employed. The bit line pitch may depend on, for example, the desired implementations and/or the memory cell being fabricated. For example, the bit line pitch ($BP_L$) is any of the bit line pitches of the semiconductor structure 100 as described above in connection with FIG. 2.

Two or more memory cells 1902 separated by the bit line dielectric 1916 can form a row and two or more rows can be disposed on the semiconductor substrate 1904. The row may be referred to as a word line. The two or more word lines are separated by any suitable dielectric material (not shown). Examples of dielectric materials include a HDP oxide.

The length from one word line to another adjacent word line may be referred to as a word line pitch. The word line pitch ($WP_L$) may vary and is not critical to the subject innovation. Any suitable word line pitch can be employed. The word line pitch may depend on, for example, the desired implementations and/or the memory cell being fabricated. In one embodiment, the word line pitch ($WP_L$) is about 60 nm or more and about 350 nm or less. In another embodiment, the word line pitch ($WP_L$) is about 80 nm or more and about 310 nm or less. In yet another embodiment, the word line pitch ($WP_L$) is about 100 nm or more and about 250 nm or less. In still yet another embodiment, the word line pitch ($WP_L$) is about 180 nm.

Figure 20:
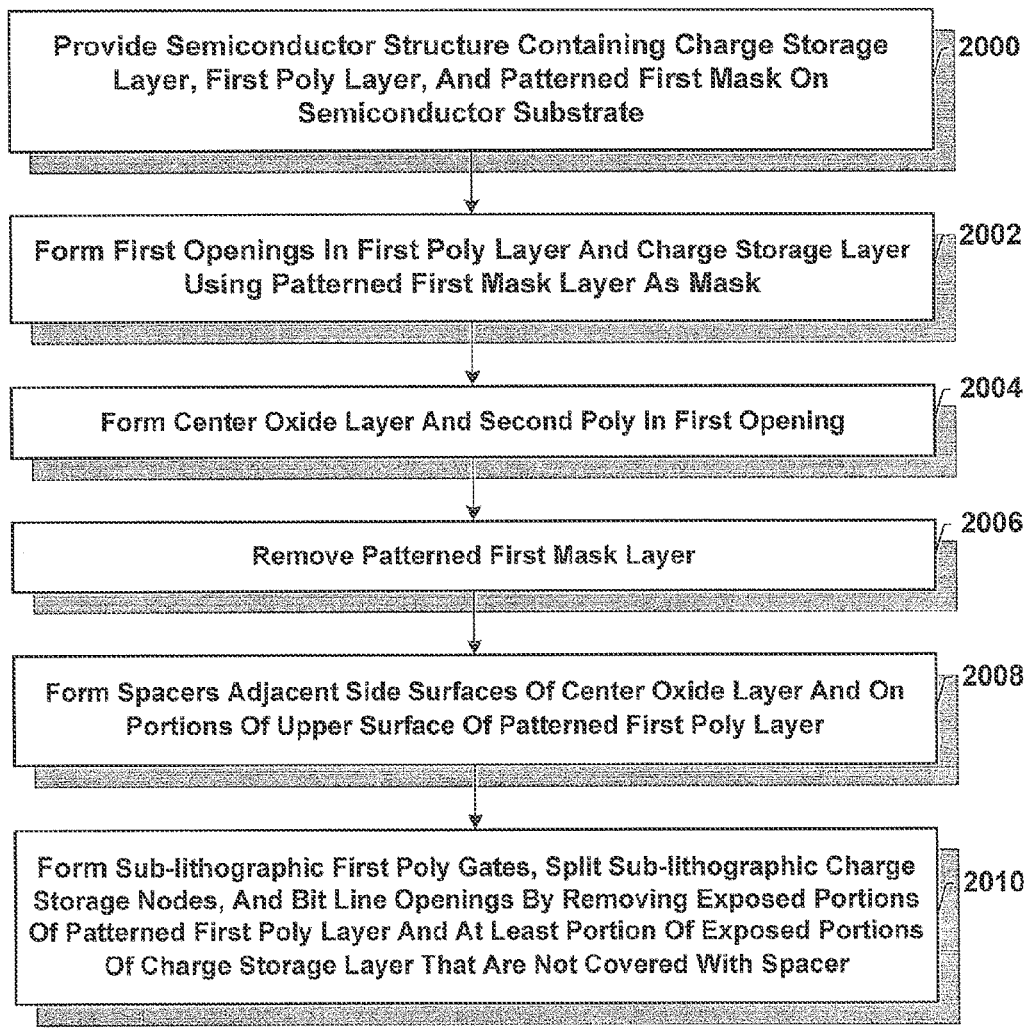
FIG. 20 illustrates an exemplary methodology for forming two split sub-lithographic charge storage nodes on a semiconductor substrate in accordance with an aspect of the subject innovation.

FIG. 20 illustrates an exemplary methodology of forming a memory cell containing two split sub-lithographic charge storage nodes on a semiconductor substrate. At 2000, a semiconductor structure containing a charge storage layer, a first poly layer, and a patterned first mask on a semiconductor substrate is provided. At 2002, first openings are formed in the first poly layer and the charge storage layer using the patterned first mask layer as a mask.

At 2004, a center oxide layer and a second poly are formed in the first opening. At 2006, the patterned first mask layer is removed. At 2008, spacers are formed adjacent side surfaces of the center oxide layer in the first opening and on portions of the upper surface of the patterned first poly layer. At 2010, sub-lithographic first poly gates, split sub-lithographic charge storage nodes, and bit line openings are formed by removing exposed portions of the patterned first poly layer and at least portion of the exposed portions of the charge storage layer that are not covered with the spacer.

Figure 21:
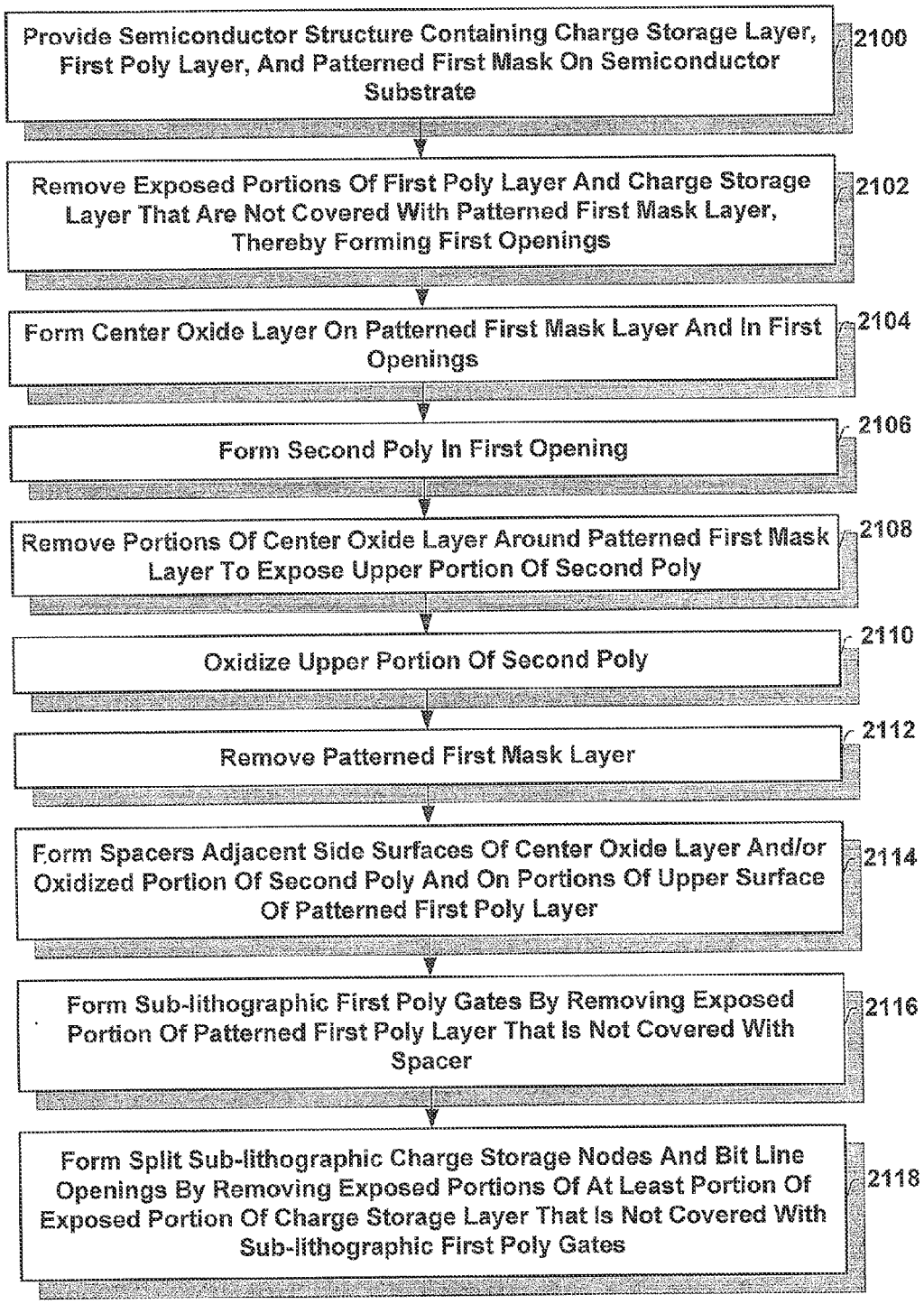
FIG. 21 illustrates another exemplary methodology for forming two split sub-lithographic charge storage nodes on a semiconductor substrate in accordance with an aspect of the subject innovation.

FIG. 21 illustrates another exemplary methodology of forming a memory cell containing two split sub-lithographic charge storage nodes on a semiconductor substrate. At 2100, a semiconductor structure containing a charge storage layer, a patterned first poly layer, and a patterned first mask layer on a semiconductor substrate is provided. The charge storage layer may contain a tri-layer containing a first oxide layer, nitride layer, and second oxide layer. At 2102, exposed portions of the first poly layer and the charge storage layer that are not covered with the patterned first mask layer are removed, thereby forming first openings. At 2104, a center oxide layer is formed around the patterned first mask layer and in the first openings. At 2106, a second poly is formed in the first opening.

At 2108, portions of the center oxide layer around the patterned first mask layer are removed to expose an upper portion of the second poly. At 2110, the upper portion of the second poly is oxidized. At 2112, the patterned first mask layer is removed. At 2114, spacers are formed adjacent side surfaces of the center oxide layer, the oxidized portion of the second poly, or a combination thereof, and on portions of the upper surface of the patterned first poly layer. At 2116 and 2168, two split sub-lithographic first poly gates, two split sub-lithographic charge storage nodes, and bit line openings are formed on the semiconductor substrate by removing an exposed portion of the patterned first poly layer and at least portion of an exposed portion of the charge storage layer that are not covered with the spacers.

Although not shown in FIG. 21, the method can further contain implanting portions of the semiconductor substrate through the bit line openings; forming a bit line dielectric in the bit line opening; removing the oxidized portion of the second poly, the spacer, and upper portions of the bit line dielectric and the second poly gate, and; forming a third poly gate over the semiconductor substrate.

Although not shown, the methodologies of FIGS. 20 and 21 may include any suitable semiconductor structure fabrication processes. General examples of semiconductor structure fabrication processes include masking, patterning, etching, planarization, cleaning, thermal oxidation, implanting, annealing, thermal treatment, and deposition techniques normally used for making semiconductor structures.

The resultant memory cell formed herein can be employed for central processing units (CPUs); volatile memory devices such as DRAM devices, SRAM devices, and the like; input/output devices (I/O chips); and non-volatile memory devices such as EEPROMs, EPROMs, PROMs, and the like.

The resultant memory cell formed herein is useful in any electronic device such as a memory device. For example, the resultant memory cell is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject innovation. It is, of course, not possible to describe every conceivable combination of components or methodologies for purposes of describing the subject innovation, but one of ordinary skill in the art may recognize that many further combinations and permutations of the subject innovation are possible. Accordingly, the subject innovation is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A memory cell, comprising:
two split sub-lithographic charge storage nodes on a semiconductor substrate;
two split sub-lithographic first poly gates on the two split sub-lithographic charge storage nodes, wherein the two split sub-lithographic first poly gates are formed by a removal of a portion of a patterned first poly surface between sloping surfaces of two spacers;
implanted portions in the semiconductor substrate under the two split sub-lithographic charge storage nodes;
a dielectric between the two split sub-lithographic charge storage nodes on the semiconductor substrate, the dielectric comprising a single layer, wherein the two spacers are formed on adjacent side surfaces of the dielectric and on portions of upper surfaces of the patterned first poly surface;
a second poly gate between the two split sub-lithographic charge storage nodes; and
a third poly gate over the semiconductor substrate.

2. The memory cell of claim 1, wherein the two sub-lithographic charge storage nodes comprise nitrides.

3. The memory cell of claim 1, wherein the dielectric between the two split sub-lithographic charge storage nodes comprises oxides.

4. The memory cell of claim 1, wherein the two sub-lithographic charge storage nodes have a length of about 5 nm or more and about 50 nm or less.

5. The memory cell of claim 1, further comprising a channel with a length of about 40 nm or more and about 200 nm or less.

6. A semiconductor structure comprising plural memory cells of claim 1, wherein a bit line pitch of the plural memory cells is about 60 nm or more and about 350 nm or less.

7. A semiconductor structure comprising plural memory cells of claim 1, wherein a bit line pitch of the plural memory cells is about 80 nm or more and about 310 nm or less.

8. The memory cell of claim 1, wherein the two split sub-lithographic charge storage nodes have a length of about 10 nm or more and about 40 nm or less.

9. The memory cell of claim 1, wherein the two split sub-lithographic charge storage nodes have a length of about 15 nm or more and about 35 nm or less.

10. The memory cell of claim 1, wherein the two split sub-lithographic first poly gates have a length of about 5 nm or more and about 50 nm or less.

11. A memory cell, comprising:
two split sub-lithographic charge storage nodes on a semiconductor substrate, the two sub-lithographic charge storage nodes have a length of about 5 nm or more and about 50 nm or less;
two split sub-lithographic first poly gates on the two split sub-lithographic charge storage nodes the two split sub-lithographic first poly gates have a length of about 5 nm or more and about 50 nm or less, wherein the two split sub-lithographic first poly gates are formed by a removal of a portion of a patterned first poly surface between sloping surfaces of two spacers;
implanted portions in the semiconductor substrate under the two split sub-lithographic charge storage nodes;
a dielectric between the two split sub-lithographic charge storage nodes on the semiconductor substrate, the dielectric comprising a single layer, wherein the two spacers are formed on adjacent side surfaces of the dielectric and on portions of upper surfaces of the patterned first poly surface;
a second poly gate between the two split sub-lithographic charge storage nodes; and
a third poly gate over the semiconductor substrate.

12. The memory cell of claim 11, wherein the two split sub-lithographic charge storage nodes comprise silicon rich silicon nitride.

13. The memory cell of claim 11, further comprising a channel that has a length of about 40 nm or more and about 200 nm or less.

14. A semiconductor structure comprising plural memory cells of claim 11, wherein a bit line pitch of the plural memory cells is about 60 nm or more and about 350 nm or less.

15. A semiconductor structure comprising plural memory cells of claim 11, wherein a bit line pitch of the plural memory cells is about 80 nm or more and about 310 nm or less.

16. The memory cell of claim 11, wherein the two split sub-lithographic charge storage nodes have a length of about 10 nm or more and about 40 nm or less.

17. The memory cell of claim 11, wherein the two split sub-lithographic charge storage nodes have a length of about 15 nm or more and about 35 nm or less.

18. The memory cell of claim 11, wherein the two split sub-lithographic first poly gates have a length of about 10 nm or more and about 40 nm or less.

19. A memory cell for storing two physically distinct bits, comprising:
two split sub-lithographic charge storage nodes on a semiconductor substrate, the two split sub-lithographic charge storage nodes each comprising three layers comprising a first and a second oxide layer sandwiching a charge storage silicon nitride layer;
two split sub-lithographic first poly gates on the two split sub-lithographic charge storage nodes, wherein the two split sub-lithographic first poly gates are formed by a removal of a portion of a patterned first poly surface between sloping surfaces of two spacers;

implanted portions in the semiconductor substrate under the two split sub-lithographic charge storage nodes;

a dielectric between the two split sub-lithographic charge storage nodes on the semiconductor substrate, the dielectric comprising a single layer, wherein the two spacers are formed on adjacent side surfaces of the dielectric and on portions of upper surfaces of the patterned first poly surface;

a second poly gate between the two split sub-lithographic charge storage nodes; and a third poly gate over the semiconductor substrate.

20. The memory cell of claim 19, wherein the charge storage silicon nitride layer of the two split sub-lithographic charge storage nodes comprises a silicon rich silicon nitride layer.

* * * * *